(12) United States Patent
Tokimatsu et al.

(10) Patent No.: US 11,567,416 B2
(45) Date of Patent: Jan. 31, 2023

(54) INSPECTION APPARATUS AND SUBSTRATE TRANSFER METHOD

(71) Applicant: Tokyo Electron Limited, Tokyo (JP)

(72) Inventors: Toru Tokimatsu, Kumamoto (JP); Takuya Tani, Kumamoto (JP); Takashi Murakami, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/361,423

(22) Filed: Jun. 29, 2021

(65) Prior Publication Data

US 2022/0011676 A1 Jan. 13, 2022

(30) Foreign Application Priority Data

Jul. 9, 2020 (JP) .............................. JP2020-118335

(51) Int. Cl.
*G03F 7/20* (2006.01)

(52) U.S. Cl.
CPC .................................. *G03F 7/7065* (2013.01)

(58) Field of Classification Search
CPC .. G03F 7/7065; B65G 47/74; G01N 21/9501; G01N 21/94; G01N 2021/945; H01L 22/12; H01L 21/67184; H01L 21/67742; H01L 21/67745; H01L 21/67775
See application file for complete search history.

(56) References Cited

U.S. PATENT DOCUMENTS

2008/0290886 A1* 11/2008 Akiyama ........... G01R 31/2893
324/750.16
2018/0143144 A1* 5/2018 Mori .................. G01N 21/9501

FOREIGN PATENT DOCUMENTS

JP 2016-212008 A 12/2016
WO WO-2015098282 A1 * 7/2015 ......... G03F 7/70541

* cited by examiner

*Primary Examiner* — Peter B Kim

(74) *Attorney, Agent, or Firm* — Posz Law Group, PLC

(57) ABSTRACT

An inspection apparatus includes: first and second stage parts on which a housing container housing substrates is mounted; first and second inspection parts having an imaging unit imaging the substrate; a first transfer region provided with a first transfer mechanism performing a first operation of transferring the substrate between the first stage part and the first inspection part; and a second transfer region provided with a second transfer mechanism performing a second operation of transferring the substrate between the second stage part and the second inspection part. In plan view, the first and second stage part are at positions not overlapping with each other, the first and second inspection part are at positions not overlapping with each other, and the first and second transfer region are at positions different from each other so as to perform the first and second operation in parallel.

20 Claims, 5 Drawing Sheets

INSPECTION APPARATUS AND SUBSTRATE TRANSFER METHOD

CROSS REFERENCE TO RELATED APPLICATIONS

This application is based upon and claims the benefit of priority of the prior Japanese Patent Application No. 2020-118335, filed in Japan on Jul. 9, 2020, the entire contents of which are incorporated herein by reference.

TECHNICAL FIELD

This disclosure relates to an inspection apparatus and a substrate transfer method.

BACKGROUND

Japanese Laid-open Patent Publication No. 2016-212008 discloses a substrate inspection method in a substrate treatment system including a plurality of treatment apparatuses performing predetermined treatments on the substrate. This inspection method acquires a first substrate image by imaging the surface of the substrate before treatment in the treatment apparatus, extracts a predetermined feature amount from the first substrate image, and selects, from a storage storing a plurality of inspection recipes set corresponding to feature amounts in different ranges, an inspection recipe corresponding to the feature amount extracted from the first substrate image. This inspection method acquires a second substrate image by imaging the surface of the substrate after treatment in the treatment apparatus, and determines the presence or absence of a defect of the substrate based on the selected inspection recipe and the second substrate image.

SUMMARY

An aspect of this disclosure is an inspection apparatus for inspecting a substrate, including: a first stage part and a second stage part on each of which a housing container configured to house the substrate is mounted; a first inspection part and a second inspection part each of which has an imaging unit configured to image the substrate for inspecting the substrate; a first transfer region where a first transfer mechanism is provided, the first transfer mechanism configured to perform a first transfer operation of transferring the substrate between the housing container mounted on the first stage part and the first inspection part; and a second transfer region where a second transfer mechanism is provided, the second transfer mechanism configured to perform a second transfer operation of transferring the substrate between the housing container mounted on the second stage part and the second inspection part, wherein: the first stage part and the second stage part are provided at positions not overlapping with each other in plan view; the first inspection part and the second inspection part are provided at positions not overlapping with each other in plan view; and the first transfer region and the second transfer region are provided at positions different from each other in plan view so as to perform the first transfer operation and the second transfer operation in parallel.

DETAILED DESCRIPTION

Figure 1:
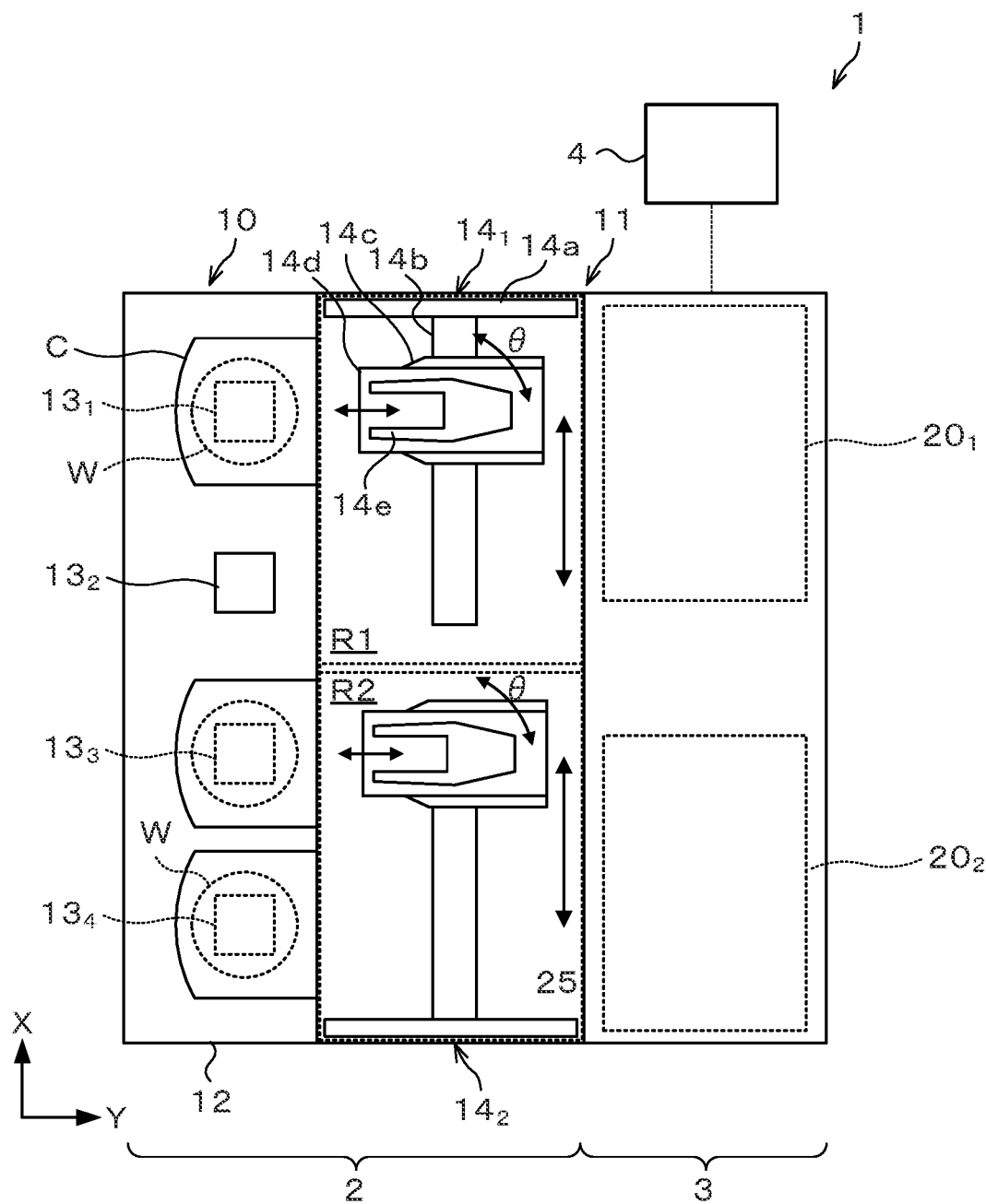
FIG. 1 is a plan view illustrating the outline of a configuration of an inspection apparatus according to an embodiment.

In a manufacturing process of a semiconductor device or the like, for example, a resist coating treatment of applying a resist solution onto a semiconductor wafer (hereinafter, referred to as a "wafer") to form a resist film, exposure processing of exposing the resist film, a developing treatment of developing the exposed resist film, and so on are sequentially performed to form a resist pattern on the wafer. The aforementioned resist coating treatment and developing treatment are performed in a coating and developing system including treatment apparatuses which perform the treatments, a transfer mechanism which transfers the wafer, and so on.

Further, when forming the resist pattern as explained above, an inspection is sometimes performed on the wafer after or before the various treatments. In this inspection, for example, whether the resist pattern is appropriately formed, whether foreign substances adhere to the wafer, or the like is inspected. For the inspection, for example, a captured image obtained by imaging the surface of the wafer being an inspection object is used.

Though an inspection part having an imaging unit which performs imaging for inspection is conventionally provided in a coating and developing system (Japanese Laid-open Patent Publication No. 2016-212008), it is recently considered that the inspection part is installed on a single apparatus not performing the resist coating treatment or the developing treatment but basically performing only inspection, and is configured as a single inspection apparatus. However, the single inspection apparatus under consideration at present has room for improvement in throughput.

Hence, the technique according to this disclosure improves the throughput in an inspection apparatus which inspects a substrate.

Hereinafter, an inspection apparatus and a substrate transfer method according to an embodiment will be explained referring to the drawings. Note that the same codes are given to components having substantially the same functional configurations in the description and the drawings to omit duplicated explanation.

Figure 2:
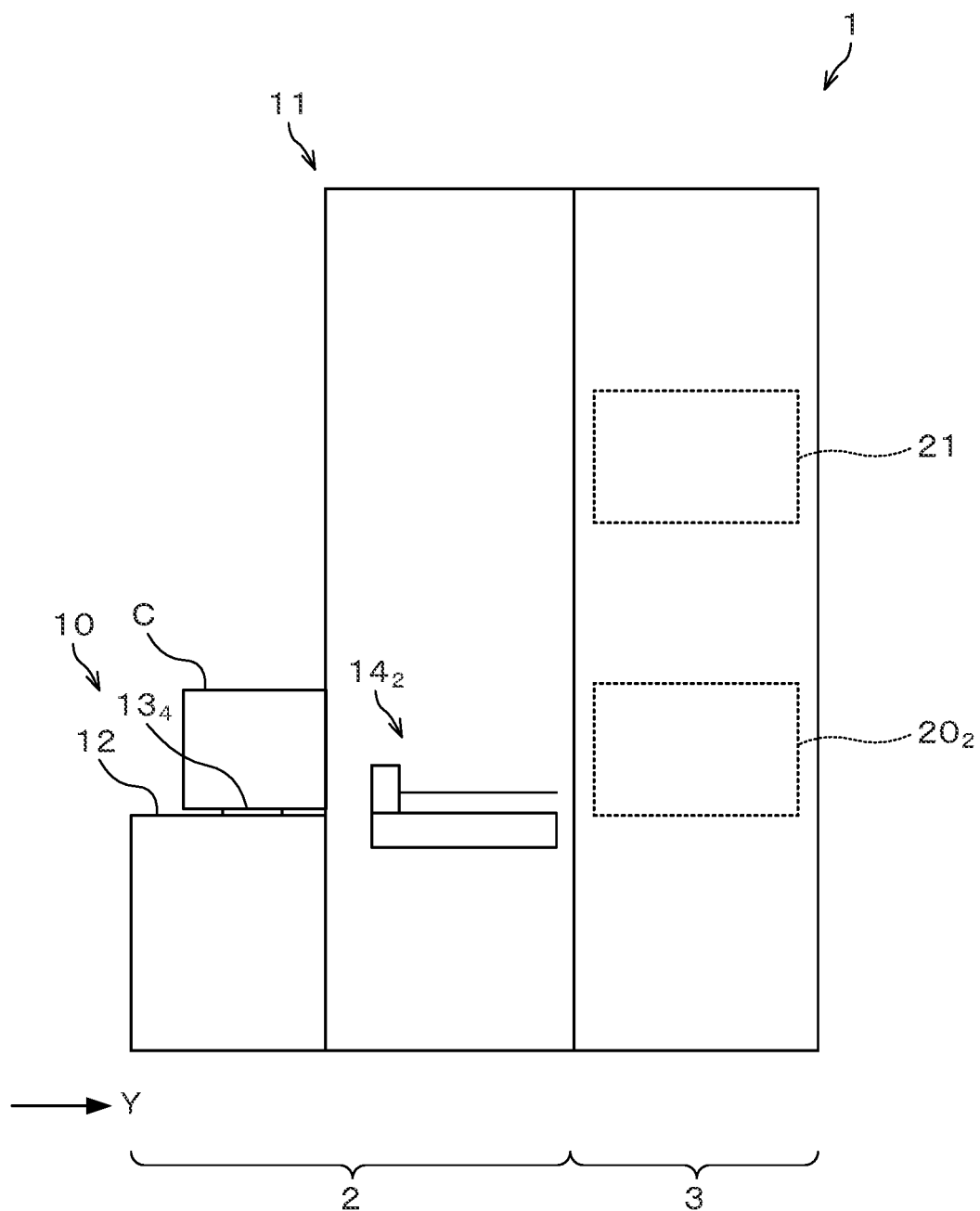
FIG. 2 is a side view illustrating the outline of the configuration of the inspection apparatus according to the embodiment.
Figure 3:
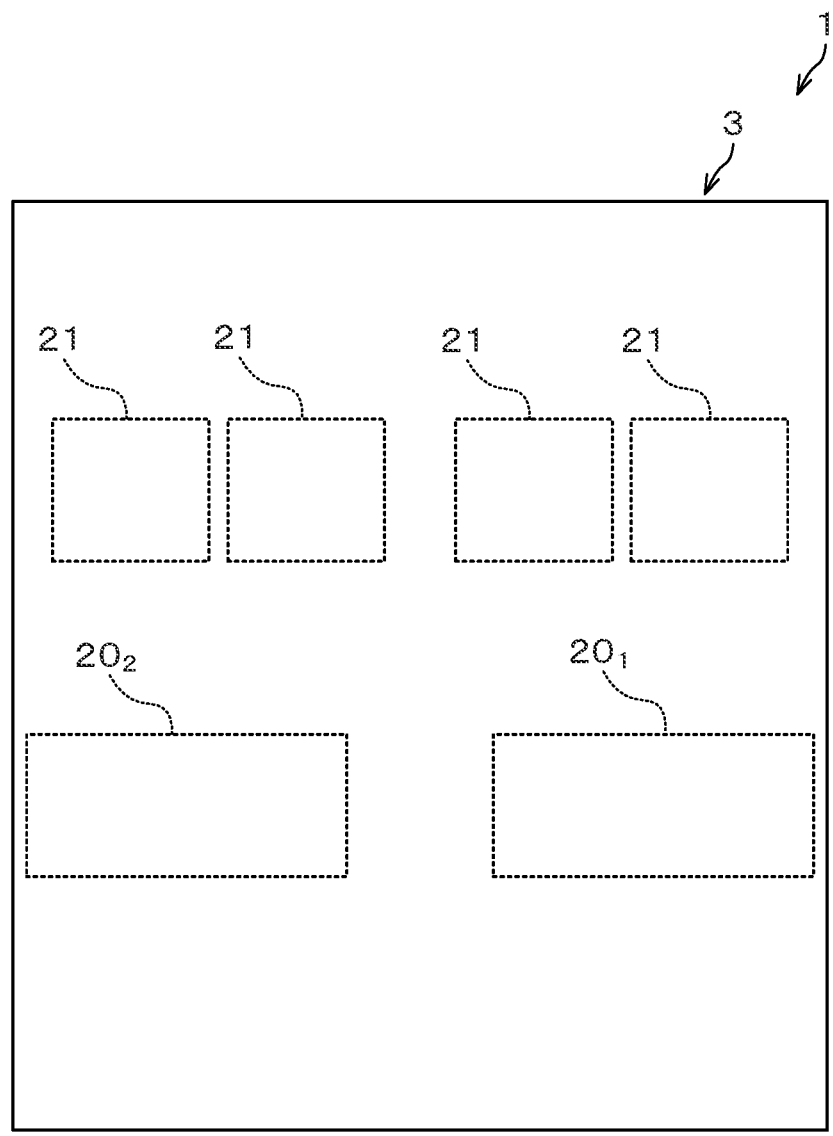
FIG. 3 is a rear view illustrating the outline of the configuration of the inspection apparatus according to the embodiment.

FIG. 1 to FIG. 3 are a plan view, a side view, and a rear view illustrating the outline of a configuration of an inspection apparatus 1 according to an embodiment, respectively.

The inspection apparatus 1 is an apparatus which inspects a wafer W as the substrate.

The inspection apparatus 1 has a cassette block 2 to/from which a cassette C is transferred in/out and an inspection block 3 provided with an inspection part having an imaging unit which performs imaging for inspection as illustrated in FIG. 1. The inspection apparatus 1 further has a controller 4 which controls the inspection apparatus 1.

The cassette block 2 has, for example, a cassette transfer in/out section 10 and a wafer transfer section 11, and is divided into them. The cassette transfer in/out section 10 is provided, for example, on an apparatus depth direction near side (Y-direction negative direction side in FIG. 1) of the inspection apparatus 1.

In the cassette transfer in/out section 10, a cassette stage 12 is provided. For example, cassette stage plates $13_1$, $13_2$ as first stage parts are provided on an apparatus width direction one side (X-direction positive side) of the cassette stage 12, and cassette stage plates $13_3$, $13_4$ as second stage parts are provided on an apparatus width direction other side (X-direction negative side in FIG. 1). The cassette stage plates $13_1$, $13_2$, $13_3$, $13_4$ are provided at positions not overlapping with one another in plan view, and concretely provided at regular intervals to be arranged in the apparatus width direction in this order from the apparatus width direction one side (X-direction positive side in FIG. 1) in the same plane. Note that the cassette stage plates $13_1$, $13_2$, $13_3$, $13_4$ are hereinafter collectively described as cassette stage plates 13 in some cases.

On the cassette stage plate 13, the cassette C as a housing container is mounted. The cassette C is a portable container configured to be able to house a plurality of wafers and to be transferable by a cassette transfer apparatus (not illustrated) such as an OHT (Overhead Hoist Transfer) provided outside the inspection apparatus 1. The cassette C is provided with a plurality of slots (not illustrated) in each of which the wafer W is accommodated.

In the wafer transfer section 11, a wafer transfer mechanism $14_1$ as a first transfer mechanism and a wafer transfer mechanism $14_2$ as a second transfer mechanism are provided. In the inspection apparatus 1, the transfer of the wafer W by the wafer transfer mechanism $14_1$ and the transfer of the wafer W by the wafer transfer mechanism $14_2$ are performed in parallel. The wafer transfer mechanisms $14_1$ and $14_2$ are hereinafter collectively described as wafer transfer mechanisms 14 in some cases. The details of the wafer transfer section 11 will be explained later.

The inspection block 3 is provided to be adjacent to the cassette block 2 on the deep side (Y-direction positive side in FIG. 1) of the cassette block 2, and concretely provided to be adjacent to the wafer transfer section 11 of the cassette block 2.

In the inspection block 3, a first inspection part $20_1$ and a second inspection part $20_2$ are provided each having an imaging unit which images the wafer W for inspecting the wafer W. The first inspection part $20_1$ and the second inspection part $20_2$ are provided at positions not overlapping with each other in plan view, and concretely provided to be arranged in the apparatus width direction (X-direction in FIG. 1) in the same plane.

The first inspection part $20_1$ is used for inspecting the wafers W housed in the cassettes C on the cassette stage plates $13_1$, $13_2$, and is provided at a position facing the cassette stage plates $13_1$, $13_2$. The second inspection part $20_2$ is used for inspecting the wafers W housed in the cassettes C on the cassette stage plates $13_3$, $13_4$, and is provided at a position facing the cassette stage plates $13_3$, $13_4$. Note that the first inspection part $20_1$ and the second inspection part $20_2$ are hereinafter collectively described as inspection parts in some cases.

A region occupied by the inspection part 20 has a rectangular shape in plan view. The inspection part 20 is provided such that a long axis direction of the region occupied by the inspection part 20 and the apparatus width direction (X-direction in FIG. 1) are parallel to each other. Further, the inspection part 20 is provided at a position at almost the same height as that of the cassette C mounted on the cassette stage plate 13.

Note that a space which a worker can enter is provided between the first inspection part $20_1$ and the second inspection part $20_2$ in the apparatus width direction (X-direction in FIG. 1).

Further, buffer parts 21 are provided in the inspection block 3 as illustrated in FIG. 2 and FIG. 3. The buffer part 21 is configured such that the wafer W transferred out of the cassette C on the cassette stage plate 13 is temporarily mounted until the wafer W is returned to the cassette C after going through the inspection part 20.

The same number of buffer parts 21 as that of, for example, the cassette stage plates 13 are provided. Further, the buffer parts 21 are provided to be arranged in the apparatus width direction (X-direction in FIG. 3), for example, above the inspection parts 20.

The controller 4 is a computer including, for example, a CPU, a memory, and so on, and has a program storage (not illustrated). The program storage stores programs for controlling the operation of the driving system such as the above wafer transfer mechanism 14 and so on to control inspection processing of the wafer W by the inspection apparatus 1. Note that the programs may be the ones which are recorded on a computer-readable storage medium and installed from the storage medium into the controller 4. The storage medium may be transitory or non-transitory. Some or all of the programs may be realized by dedicated hardware (circuit board).

Subsequently, the wafer transfer section 11 will be explained.

The wafer transfer section 11 has, as illustrated in FIG. 1, a first transfer region R1 where the wafer transfer mechanism $14_1$ is provided and a second transfer region R2 where the wafer transfer mechanism $14_2$ is provided. The wafer transfer mechanism $14_1$ in the first transfer region R1 performs a first transfer operation of transferring the wafer W between the cassette C mounted on the cassette stage plate $13_1$, $13_2$ and the first inspection part $20_1$. The wafer transfer mechanism $14_2$ in the second transfer region R2 performs a second transfer operation of transferring the wafer W between the cassette C mounted on the cassette stage plate $13_3$, $13_4$ and the second inspection part $20_2$.

The wafer transfer mechanism 14 has, for example, a guide frame 14a, a rail member 14b, a movable body 14c, a pivoting body 14d, and a transfer arm 14e as a substrate holder.

The guide frame 14a guides the rail member 14b in the vertical direction. The rail member 14b is provided to extend along the apparatus width direction (X-direction in FIG. 1), and rises and lowers along the guide frame 14a. The movable body 14c moves along the rail member 14b, namely, along the apparatus width direction (X-direction in FIG. 1). The pivoting body 14d pivots on the movable body 14c. The transfer arm 14e is for holding the wafer W and is provided on the pivoting body 14d via a member (not illustrated) configured to be expandable and contractable. With the above configuration, the transfer arm 14e is movable in the width direction (X-direction in FIG. 1), the depth direction (Y-direction in FIG. 1), a θ-direction, and the vertical direction.

The first transfer region R1 and the second transfer region R2 are provided at positions different from each other in plan view so as to perform the first transfer operation by the wafer transfer mechanism $14_1$ and the second transfer operation by the wafer transfer mechanism $14_2$ in parallel. The positions different from each other in plan view where the first transfer operation and the second transfer operation can be performed in parallel are positions where the first transfer region R1 and the second transfer region R2 do not overlap with each other at all in plan view. Besides, the above positions different from each other in plan view where the first transfer operation and the second transfer operation can be performed in parallel may be the following positions. Specifically, the positions may be, for example, positions where the first transfer region R1 and the second transfer region R2 partly overlap with each other in plan view to such an extent that the interference between the transfer arms 14e can be avoided by adjusting the operation of the transfer arm 14e in the first transfer operation or the second transfer operation. In this embodiment, the first transfer region R1 and the second transfer region R2 are assumed to be provided at the positions partly overlapping with each other as explained above. Note that the first transfer region R1 is composed of a region where non-movable parts such as the guide frame 14a of the wafer transfer mechanism $14_1$ and the like are located and a region through which movable parts such as the transfer arm 14e of the wafer transfer mechanism $14_1$ and the like and the wafer W held by the transfer arm 14e of the wafer transfer mechanism $14_1$ can pass. Besides, the second transfer region R2 is composed of a region where non-movable parts of the wafer transfer mechanism $14_2$ are located and a region through which movable parts of the wafer transfer mechanism $14_2$ and the transfer arm 14e of the wafer transfer mechanism $14_2$ can pass.

The first transfer region R1 and the second transfer region R2 are provided to be arranged in the apparatus width direction (X-direction in the drawing) between the cassette stage plates $13_1$, $13_2$, $13_3$, $13_4$, and, the first inspection part $20_1$ and the second inspection part $20_2$. The first transfer region R1 is provided between the cassette stage plates $13_1$, $13_2$ and the first inspection part $20_1$, and the second transfer region R2 is provided between the cassette stage plates $13_3$, $13_4$, and, the second inspection part $20_2$. Further, in this embodiment, a part on the apparatus width direction other side (X-direction negative side in the drawing) of the first transfer region R1 and a part on the apparatus width direction one side (X-direction positive side in the drawing) of the second transfer region R2 partly overlap with each other in plan view.

Besides, each of the first transfer region R1 and the second transfer region R2 has a rectangular shape in plan view, and its long axis direction and the apparatus width direction (X-direction in FIG. 1) are parallel to each other.

Note that the inspection apparatus 1 configured as explained above is, in other words, the combinations arranged in the horizontal direction each composed of the cassette stage plates 13, the wafer transfer mechanism 14, and the inspection part 20.

Figure 4:
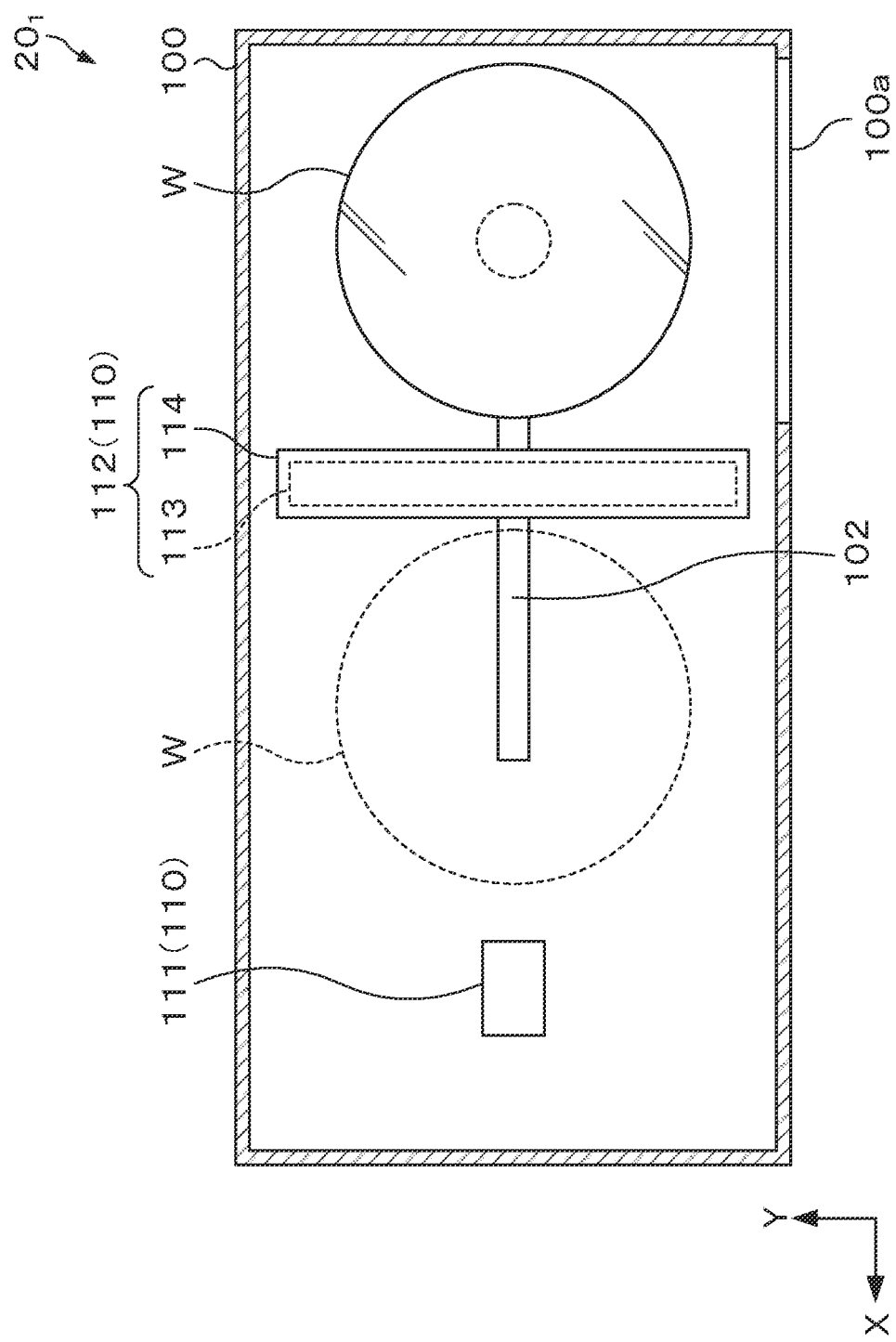
FIG. 4 is a transverse sectional view illustrating the outline of a configuration of a first inspection part.
Figure 5:
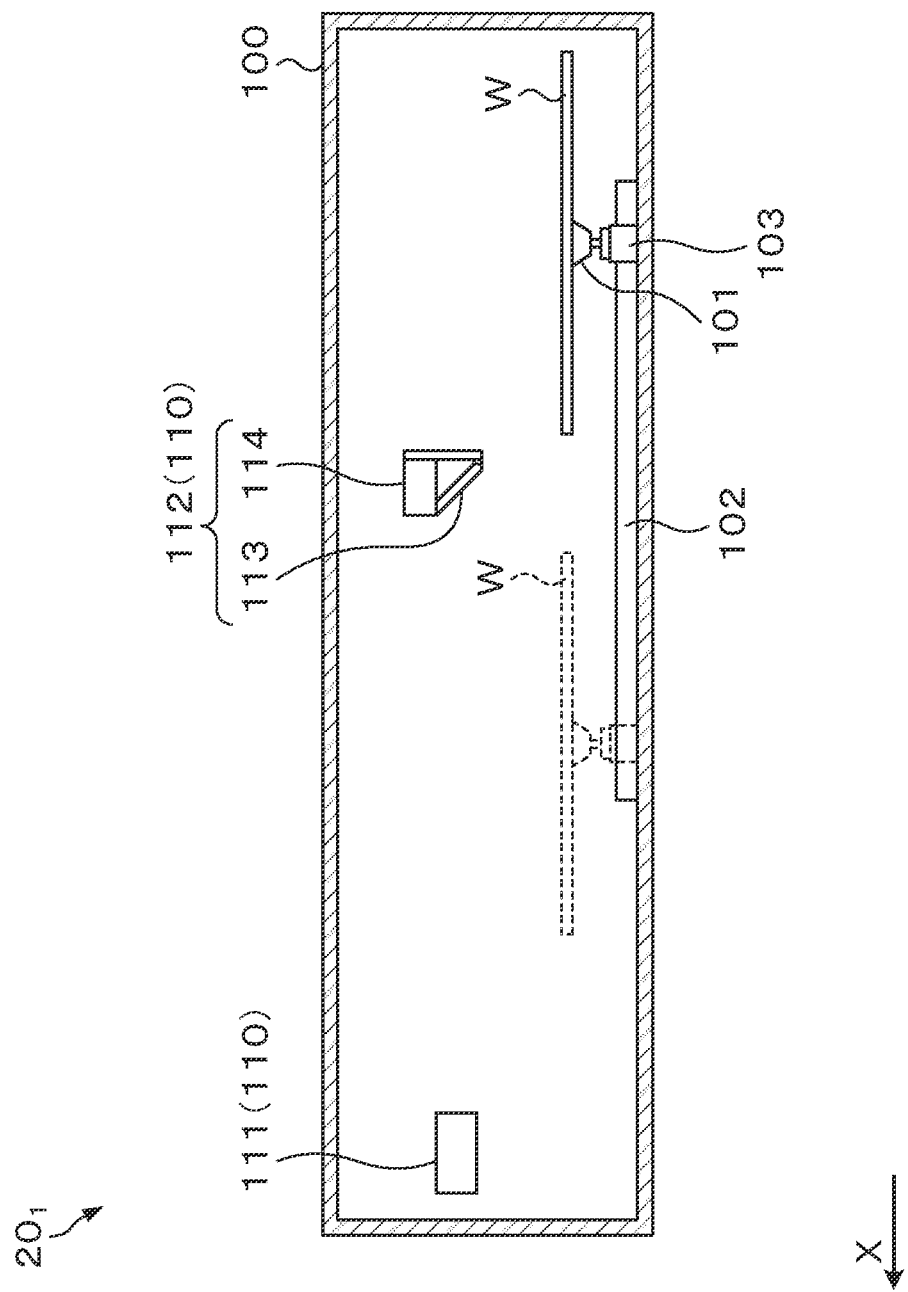
FIG. 5 is a longitudinal sectional view illustrating the outline of the configuration of the first inspection part.

Next, the configuration of the above-explained first inspection part $20_1$ is explained. FIG. 4 and FIG. 5 are a transverse sectional view and a longitudinal sectional view illustrating the outline of the configuration of the first inspection part $20_1$, respectively.

The first inspection part $20_1$ has a casing 100 as illustrated in FIG. 4. On the apparatus width direction other side (X-direction negative side in FIG. 4) on a side wall on the near side (Y-direction negative direction side in FIG. 4) of the casing 100, a transfer-in/out port 100a is formed for transferring in/out the wafer W to/from the casing 100. The transfer-in/out port 100a is provided at a position farther from the second transfer region R2 than is the cassette stage plate $13_2$. Accordingly, when transferring the wafer W between the cassette C on the cassette stage plate $13_2$ and the first inspection part $20_1$, it is unnecessary to move the transfer arm 14e toward the second transfer region R2, and therefore it is possible to prevent the interference between the transfer arms 14e between the first inspection part $20_1$ and the second inspection part $20_2$.

Further, in the casing 100, a wafer chuck 101 which holds the wafer W is provided as illustrated in FIG. 5.

At the bottom surface of the casing 100, a guide rail 102 extending from one end side (X-direction negative direction side in FIG. 4) to the other end side (X-direction positive direction side in FIG. 4) in the casing 100. On the guide rail 102, a driver 103 is provided which rotates the wafer chuck 101 and is movable along the guide rail 102. The driver 103 corresponds to a "rotation mechanism" of the technique relating to this disclosure. With this configuration, the wafer W held on the wafer chuck 101 is movable.

Further, an imaging unit 110 is provided in the casing 100.

The imaging unit 110 has a camera 111 and a lighting module 112.

The camera 11 is provided at an upper part on the other end side (X-direction positive direction side in FIG. 4) in the casing 100 and has a lens (not illustrated) and an imaging element (not illustrated) such as a CMOS image sensor.

The lighting module 112 is provided above the center in the casing 100, and has a half mirror 113 and a light source 114. The half mirror 113 is provided at a position facing the camera 111 in such a state that its mirror surface is inclined upward at 45 degrees toward the camera 111 from a state of being directed vertically downward. The light source 114 is provided above the half mirror 113. The lighting from the light source 114 passes through the half mirror 113 and is applied downward. Further, the light having passed through the half mirror 113 is reflected from an object existing below the half mirror 113, further reflected from the half mirror 113, and captured into the camera 111. In other words, the camera 111 can image the object existing in an irradiation region by the light source 114. Accordingly, when the wafer chuck 101 holding the wafer W moves along the guide rail 102, the camera 111 can image the entire surface of the wafer W which passes through the irradiation region of the light source 114. Then, data on the image captured by the camera 111 is inputted into the controller 4.

Note that the configuration of the second inspection part $20_2$ is basically the same as the configuration of the above first inspection part $20_1$ and elements of the second inspection part $20_2$ are arranged at positions line-symmetrical to the same elements of the first inspection part $20_1$ about the center axis in the apparatus width direction. Accordingly, the second inspection part $20_2$ has a transfer-in/out port 100a for transferring in/out the wafer W to/from the casing 100, which is formed on the apparatus width direction one side (X-direction positive side in the drawing) on a side wall on the near side (Y-direction negative direction side in the drawing) of the casing 100.

Next, the processing on the wafer W performed in the inspection apparatus 1 configured as above will be explained.

(1. Decision of a Transfer Route)

First, when the cassette C is mounted on the cassette stage plate 13 or the like, the controller 4 decides a transfer route for each of the wafers W in the cassette C. For the decision of the transfer route, the controller 4 acquires the following transfer recipe as a transfer recipe designating a transfer route for a substrate, namely, acquires a transfer recipe including both of the first inspection part $20_1$ and the second inspection part $20_2$ as inspection parts in the transfer route for the wafer W. More specifically, the controller 4 acquires the transfer recipe in which the information on the inspection part in the transfer route for the wafer W passing through only one inspection part is "the first inspection part $20_1$ or the second inspection part $20_2$". 'Passing through only one inspection part' means the wafer is inspected at the one inspection part as part of its transfer route.

Subsequently, the controller 4 deletes, from the transfer recipe, the inspection part 20, of the first inspection part $20_1$ and the second inspection part $20_2$, which is associated with the cassette stage plate 13 on which the cassette C of the wafer W being a transfer object, namely, the wafer W being a transfer route decision object is mounted. A cassette stage plate 13 is 'associated with' the inspection part 20 which is to be deleted, e.g., 'associated for deletion with'. For example, when the cassette C is mounted on the cassette stage plate $13_1$ as the first stage part, the controller 4 deletes, from the transfer recipe, the second inspection part $20_2$ which is associated with the cassette stage plate $13_1$ so that imaging for inspection is performed in the first inspection part $20_1$ on the wafer W in the cassette C. Thus, the transfer route for the wafer W is decided. The information associating the cassette stage plate 13 on which the cassette C is mounted with the inspection part 20 to be deleted is stored in advance in the storage (not illustrated). Note that the information on which cassette stage plate 13 the cassette housing the wafer W being the transfer object is mounted on is decided by the controller 4, an external control apparatus (for example, a host computer), or the like, and stored in the storage (not illustrated).

The controller 4 then performs control based on the decided transfer route, namely, the transfer recipe after the deletion, and thereby performs the transfer of the wafer W as explained below.

(2. Transfer to the Inspection Part 20)

Upon decision of the transfer route for the wafer W, the wafer W is transferred to the inspection part 20 corresponding to the cassette stage plate 13 on which the cassette C of the wafer W is mounted, based on the information on the transfer route. For example, the wafer W in the cassette C mounted on the cassette stage plate $13_1$ or the cassette stage plate $13_2$ is transferred by the wafer transfer mechanism $14_1$ to the first inspection part $20_1$ corresponding to the cassette stage plate $13_1$ or the cassette stage plate $13_2$. The wafer W in the cassette C mounted on the cassette stage plate $13_3$ or the cassette stage plate $13_4$ is transferred by the wafer transfer mechanism $14_2$ to the second inspection part $20_2$ corresponding to the cassette stage plate $13_3$ or the cassette stage plate $13_4$.

(3. Inspection)

Upon transfer of the wafer W to the inspection part $20_1$ the imaging unit 110 images the surface of the wafer W under the control of the controller 4. The controller 4 then inspects the wafer W based on the imaging result by the imaging unit 110.

(4. Transfer Out of the Inspection Part 20)

Upon completion of the imaging by the imaging unit 110, the wafer W is returned to the original cassette C based on the above-explained information on the transfer route. For example, the wafer W inspected in the first inspection part $20_1$ is transferred by the wafer transfer mechanism $14_1$ to the original cassette C mounted on the cassette stage plate $13_1$ or the cassette stage plate $13_2$. Besides, the wafer W inspected in the second inspection part $20_2$ is transferred by the wafer transfer mechanism $14_2$ to the original cassette C mounted on the cassette stage plate $13_3$ or the cassette stage plate $13_4$.

In the above 2. Transfer to the inspection part 20 and in the above 4. Transfer out of the inspection part $20_1$ the rotation of the transfer arm $14e$ of the wafer transfer mechanism $14_1$ more specifically, the pivoting of the pivoting body $14d$ is performed. Then, as explained above, a part on the apparatus width direction other side (X-direction negative side in the drawing) of the first transfer region R1 and a part on the apparatus width direction one side (X-direction positive side in the drawing) of the second transfer region R2 overlap with each other in plan view. Therefore, due to the pivoting operation of the pivoting body $14d$ of the wafer transfer mechanism 14, included in the transfer operation to the cassette C mounted on the cassette stage plate $13_2$ and the pivoting operation of the pivoting body $14d$ of the wafer transfer mechanism $14_2$ included in the transfer operation to the cassette C mounted on the cassette stage plate $13_3$, the pivoting bodies $14d$ may interfere with each other.

To avoid the above situation, in the above 2. Transfer to the inspection part 20 and in the above 4. Transfer out of the inspection part $20_1$ the timing to start the pivoting operation of the pivoting body $14d$ is adjusted. More specifically, in the transfer from the cassette C mounted on the cassette stage plate $13_2$ to the first inspection part $20_1$, the movable body $14c$ of the wafer transfer mechanism $14_1$ which has received the wafer W from the cassette C moves by a predetermined distance to the apparatus width direction one side (X-direction positive side in the drawing), and then the pivoting of the pivoting body $14d$ of the wafer transfer mechanism $14_1$ is started. In the transfer from the cassette C mounted on the cassette stage plate $13_3$ to the second inspection part $20_2$, the movable body $14c$ of the wafer transfer mechanism $14_2$ which has received the wafer W from the cassette C moves by a predetermined distance to the apparatus width direction other side (X-direction negative side in the drawing), and then the pivoting of the pivoting body $14d$ of the wafer transfer mechanism $14_2$ is started. The movement amount in the apparatus width direction (X-direction in the drawing) of the movable body $14c$ until the pivoting of the pivoting body $14d$ is started is an amount which does not cause the interference between the pivoting bodies $14d$ in the pivoting of the pivoting body $14d$ after the movement.

Besides, in the transfer out of the first inspection part $20_1$ to the cassette C mounted on the cassette stage plate $13_2$, the pivoting body $14d$ of the wafer transfer mechanism $14_1$ which has received the wafer W from the first inspection part $20_1$ is pivoted by a predetermined angle, and then the movement of the movable body $14c$ of the wafer transfer mechanism $14_1$ to the apparatus width direction other side (X-direction negative side in the drawing) is started. In the transfer out of the second inspection part $20_2$ to the cassette C mounted on the cassette stage plate $13_3$, the pivoting body $14d$ of the wafer transfer mechanism $14_2$ which has received the wafer W from the second inspection part $20_2$ is pivoted by a predetermined angle, and then the movement of the movable body $14c$ of the wafer transfer mechanism $14_2$ to the apparatus width direction one side (X-direction positive side in the drawing) is started. The pivoting amount of the pivoting body $14d$ until the movement of the movable body $14c$ is started is an amount which does not cause the interference between the pivoting bodies $14d$ in the movement of the movable body $14c$ after the pivoting, and is, for example, 120°.

As explained above, the inspection apparatus 1 in this embodiment has the cassette stage plates $13_1$ to $13_4$ on each of which the cassette C is mounted, and the first inspection part $20_1$ and the second inspection part $20_2$ each having the imaging unit 110 which images the wafer W. The inspection apparatus 1 further has the first transfer region R1 where the wafer transfer mechanism $14_1$ is provided which performs the first transfer operation of transferring the wafer W between the cassette C mounted on the cassette stage plate $13_1$, $13_2$ and the first inspection part $20_1$, and the second transfer region R2 where the wafer transfer mechanism $14_2$ is provided which performs the second transfer operation of transferring the wafer W between the cassette C mounted on the cassette stage plate $13_3$, $13_4$ and the second inspection part $20_2$. The cassette stage plates $13_1$, $13_2$ and the cassette stage plates $13_3$, $13_4$ are provided at positions not overlapping with each other in plan view. Further, in the inspection apparatus 1, the first transfer region R1 and the second transfer region R2 are provided at positions different from each other in plan view so as to perform the first transfer operation and the second transfer operation in parallel. Accordingly, the transfer operation by the wafer transfer mechanism $14_1$ and the transfer operation by the wafer transfer mechanism $14_2$ can be performed in parallel, thus improving the throughput.

Besides, in this embodiment, the first transfer region R1 and the second transfer region R2 partly overlap with each other in plan view. Therefore, the footprint of the inspection apparatus 1 can be suppressed.

Further, the inspection apparatus 1 according to this embodiment is configured such that the combinations each composed of the cassette stage plates 13, the wafer transfer mechanism $14_1$ and the inspection part 20 are arranged in the horizontal direction. The configuration in which the above combinations are arranged in the horizontal direction as above provides the following effects as compared with the configuration in which the combinations are arranged in the vertical direction. In the case of arranging the above combinations in the vertical direction, the maintenance workability for the inspection part 20 located at the upper tier is inferior. In contrast to this, in the case of arranging the above combinations in the horizontal direction, the maintenance workability for any inspection part 20 is never inferior.

Further, unlike this embodiment, such a configuration that the cassette stage plates 13 are arranged in the horizontal direction and the inspection parts 20 are arranged in the vertical direction is also conceivable but, as compared with this configuration, the configuration according to this embodiment in which both of the cassette stage plates 13 and the inspection parts 20 are arranged in the horizontal direction provides, for example, the following effects (1), (2).

(1) In the case of the configuration in which the cassette stage plates 13 are arranged in the horizontal direction and the inspection parts 20 are arranged in the vertical direction, the wafer transfer mechanism 14 for one inspection part 20 needs to have a low-layer structure and the wafer transfer mechanism 14 for the other inspection part 20 needs to have a high-layer structure, resulting in a complicated design. In contrast to this, in the configuration in which both of the cassette stage plates 13 and the inspection parts 20 are arranged in the horizontal direction as in this embodiment, the design for the wafer transfer mechanisms 14 is never complicated, unlike the above case.

(2) In the case of the configuration in which the cassette stage plates 13 are arranged in the horizontal direction and the inspection parts 20 are arranged in the vertical direction, there occurs a difference in moving distance of the transfer arm 14e between the wafer transfer mechanism 14 for one inspection part 20 and the wafer transfer mechanism 14 for the other inspection part $20_1$ resulting in a complicated control for the wafer transfer. In contrast to this, in the configuration in which both of the cassette stage plates 13 and the inspection parts 20 are arranged in the horizontal direction as in this embodiment, there occurs no difference in moving distance of the transfer arm 14e between the wafer transfer mechanisms 14, thus preventing the control of the wafer transfer from being complicated.

In this embodiment, the cassette transfer in/out section 10 has a rectangular shape long in the apparatus width direction (X-direction in FIG. 1) in plan view. Besides, the inspection part 20 is provided such that the long axis direction of the region in the rectangular shape in plan view occupied by the inspection part 20 and the apparatus width direction (X-direction in FIG. 1) are parallel to each other, and the first transfer region R1 and the second transfer region R2 each have the rectangular shape in plan view such that its long axis direction and the apparatus width direction (X-direction in FIG. 1) are parallel to each other. Therefore, according to this embodiment, the size in the depth direction (Y-direction in the drawing) of the inspection apparatus can be suppressed.

Further, in this embodiment, the space which the worker can enter is provided between the first inspection part $20_1$ and the second inspection part $20_2$ in the apparatus width direction (X-direction in FIG. 1). The worker enters the above space for maintenance or the like and thereby can perform a work from the apparatus width direction other side (X-direction negative side in FIG. 1) for the first inspection part $20_1$, a work from the apparatus width direction one side (X-direction positive side in FIG. 1) for the second inspection part $20_2$, and a work from the deep side (Y-direction positive direction side in the drawing) for the wafer transfer section 11.

Further, this embodiment has the buffer part 21. The controller 4 may control the transfer of the wafer W as follows using the buffer part 21. More specifically, the controller 4 may control the transfer of the wafer W such that the wafer W is temporarily mounted on the buffer part 21 and returned to a slot different from a slot in which the wafer W has been accommodated before the transfer. This can facilitate the identification of the process where a product defect has occurred.

Note that in the inspection part 20, a detector (not illustrated) may be provided which detects a notch being a reference for the orientation of the wafer W. The detector has a light emitter composed of an LED (Light Emitting Diode) provided at a position facing a front surface side of a peripheral portion of the wafer W, and a light receiver composed of a PD (Photodiode) provided at a position facing the light emitter and a rear surface side of the peripheral portion of the wafer W. The detector detects the notch of the wafer W based on a change in amount of light incident on the light receiver. Note that the detection of the notch may be performed based on the imaging result in the imaging unit 110. The controller 4 then controls the driver 103 of the inspection part 20 based on the notch detection result in the detector and thereby can perform the processing (wafer orientation adjustment processing) of adjusting the orientation of the wafer W. By the wafer orientation adjustment processing, for example, the wafer W can be returned, in a predetermined orientation, to the cassette C. Further, by the wafer orientation adjustment processing, all of the wafers W in the cassette C can be brought into the same orientation or the orientations of every plurality of wafers W can be made different from one another.

Note that the inspection apparatus 1 may have a cassette delivery part (not illustrated) which performs delivery of the cassette C between the cassette transfer apparatus such as the OHT provided outside the inspection apparatus 1 and the cassette stage plate 13. The cassette delivery part has, for example, a standby part where the cassette C delivered from the cassette transfer apparatus or the cassette C to be delivered to the cassette transfer apparatus is mounted, and an internal transfer mechanism which transfers the cassette C between the standby part and the cassette stage plate 13.

The embodiments disclosed herein are examples in all respects and should not be considered to be restrictive. Various omissions, substitutions and changes may be made in the embodiments without departing from the scope and spirit of the attached claims.

According to this disclosure, it is possible to improve the throughput in an inspection apparatus which inspects a substrate.

What is claimed is:

1. An inspection apparatus for inspecting a substrate, comprising:
    a first stage part and a second stage part on each of which a housing container configured to house the substrate is mounted;
    a first inspection part and a second inspection part each of which has an imaging unit configured to image the substrate for inspecting the substrate;
    a first transfer region where a first transfer mechanism is provided, the first transfer mechanism configured to perform a first transfer operation of transferring the substrate between the housing container mounted on the first stage part and the first inspection part; and
    a second transfer region where a second transfer mechanism is provided, the second transfer mechanism configured to perform a second transfer operation of transferring the substrate between the housing container mounted on the second stage part and the second inspection part, wherein:
    the first stage part and the second stage part are provided at positions not overlapping with each other in plan view;
    the first inspection part and the second inspection part are provided at positions not overlapping with each other in plan view;
    the first transfer region and the second transfer region are provided at positions different from each other in plan view so as to perform the first transfer operation and the second transfer operation in parallel; and
    the first transfer region and the second transfer region are provided so as to partly overlap with each other in an apparatus width direction in plan view.

2. The inspection apparatus according to claim 1, wherein a plurality of the first stage parts and a plurality of the second stage parts are provided.

3. The inspection apparatus according to claim 2, wherein:
    the first stage part and the second stage part are provided to be arranged in the apparatus width direction;
    the first inspection part and the second inspection part are provided to be arranged in the apparatus width direction, wherein a set of the first inspection part and the second inspection part and a set of the first stage part and the second stage part are, in plan view, arranged in a direction crossing the apparatus width direction; and
    the first transfer region and the second transfer region are provided to be arranged in the apparatus width direction between the first stage part and the second stage part, and, the first inspection part and the second inspection part.

4. The inspection apparatus according to claim 2, further comprising
    a buffer part on which the substrate transferred out of the housing container is temporarily mounted until the substrate is returned to the housing container.

5. The inspection apparatus according to claim 4, wherein:
    the housing container has a plurality of slots in each of which the substrate is accommodated; and
    the inspection apparatus further comprises a controller configured to control the transfer of the substrate so that the substrate is temporarily mounted on the buffer part and returned to a slot different from a slot in which the substrate has been accommodated before the transfer.

6. The inspection apparatus according to claim 1, wherein:
    the first stage part and the second stage part are provided to be arranged in the apparatus width direction;
    the first inspection part and the second inspection part are provided to be arranged in the apparatus width direction, wherein a set of the first inspection part and the second inspection part and a set of the first stage part and the second stage part are, in plan view, arranged in a direction crossing the apparatus width direction; and
    the first transfer region and the second transfer region are provided to be arranged in the apparatus width direction between the first stage part and the second stage part, and, the first inspection part and the second inspection part.

7. The inspection apparatus according to claim 6, further comprising
    a buffer part on which the substrate transferred out of the housing container is temporarily mounted until the substrate is returned to the housing container.

8. The inspection apparatus according to claim 7, wherein:
    the housing container has a plurality of slots in each of which the substrate is accommodated; and
    the inspection apparatus further comprises a controller configured to control the transfer of the substrate so that the substrate is temporarily mounted on the buffer part and returned to a slot different from a slot in which the substrate has been accommodated before the transfer.

9. The inspection apparatus according to claim 1, wherein:
    each of the first transfer mechanism and the second transfer mechanism has a substrate holder configured to hold the substrate; and
    timing to start an operation of rotating the substrate holder is adjusted so as to prevent the first transfer mechanism and the second transfer mechanism from interfering with each other.

10. The inspection apparatus according to claim 1, further comprising
    a buffer part on which the substrate transferred out of the housing container is temporarily mounted until the substrate is returned to the housing container.

11. The inspection apparatus according to claim 1, wherein:
    each of the first inspection part and the second inspection part has a rotation mechanism configured to rotate the substrate; and
    the inspection apparatus further comprises a controller configured to control the rotation mechanism so that the substrate is returned, in a predetermined orientation, to the housing container.

12. An inspection apparatus for inspecting a substrate, comprising:

a first stage part and a second stage part on each of which a housing container configured to house the substrate is mounted;

a first inspection part and a second inspection part each of which has an imaging unit configured to image the substrate for inspecting the substrate;

a first transfer region where a first transfer mechanism is provided, the first transfer mechanism configured to perform a first transfer operation of transferring the substrate between the housing container mounted on the first stage part and the first inspection part;

a second transfer region where a second transfer mechanism is provided, the second transfer mechanism configured to perform a second transfer operation of transferring the substrate between the housing container mounted on the second stage part and the second inspection part; and a buffer part on which the substrate transferred out of the housing container is temporarily mounted until the substrate is returned to the housing container, wherein:

the first stage part and the second stage part are provided at positions not overlapping with each other in plan view;

the first inspection part and the second inspection part are provided at positions not overlapping with each other in plan view; and the first transfer region and the second transfer region are provided at positions different from each other in plan view so as to perform the first transfer operation and the second transfer operation in parallel, wherein:

the housing container has a plurality of slots in each of which the substrate is accommodated; and the inspection apparatus further comprises a controller configured to control the transfer of the substrate so that the substrate is temporarily mounted on the buffer part and returned to a slot different from a slot in which the substrate has been accommodated before the transfer.

13. The inspection apparatus according to claim 12, wherein the first transfer region and the second transfer region are provided so as to partly overlap with each other in an apparatus width direction in plan view.

14. The inspection apparatus according to claim 13, wherein:

each of the first transfer mechanism and the second transfer mechanism has a substrate holder configured to hold the substrate; and timing to start an operation of rotating the substrate holder is adjusted so as to prevent the first transfer mechanism and the second transfer mechanism from interfering with each other.

15. The inspection apparatus according to claim 12, wherein a plurality of the first stage parts and a plurality of the second stage parts are provided.

16. An inspection apparatus for inspecting a substrate, comprising:

a first stage part and a second stage part on each of which a housing container configured to house the substrate is mounted;

a first inspection part and a second inspection part each of which has an imaging unit configured to image the substrate for inspecting the substrate;

a first transfer region where a first transfer mechanism is provided, the first transfer mechanism configured to perform a first transfer operation of transferring the substrate between the housing container mounted on the first stage part and the first inspection part; and a second transfer region where a second transfer mechanism is provided, the second transfer mechanism configured to perform a second transfer operation of transferring the substrate between the housing container mounted on the second stage part and the second inspection part, wherein:

the first stage part and the second stage part are provided at positions not overlapping with each other in plan view;

the first inspection part and the second inspection part are provided at positions not overlapping with each other in plan view; and the first transfer region and the second transfer region are provided at positions different from each other in plan view so as to perform the first transfer operation and the second transfer operation in parallel, further comprising a controller configured to control the transfer of the substrate based on a transfer recipe designating a transfer route for the substrate, the controller being configured to:

acquire the transfer recipe including both of the first inspection part and the second inspection part as a transfer destination on the transfer route;

delete, from the transfer recipe, an inspection part associated for deletion with a stage part on which the housing container of a substrate being a transfer object is mounted of the first inspection part and the second inspection part; and control the transfer of the substrate based on the transfer recipe after the deletion.

17. The inspection apparatus according to claim 16, wherein the first transfer region and the second transfer region are provided so as to partly overlap with each other in the apparatus width direction in plan view.

18. The inspection apparatus according to claim 17, wherein:

each of the first transfer mechanism and the second transfer mechanism has a substrate holder configured to hold the substrate; and timing to start an operation of rotating the substrate holder is adjusted so as to prevent the first transfer mechanism and the second transfer mechanism from interfering with each other.

19. The inspection apparatus according to claim 16, wherein a plurality of the first stage parts and a plurality of the second stage parts are provided.

20. A method of transferring a substrate in a substrate inspection apparatus for inspecting a substrate, the substrate inspection apparatus comprising: a first stage part and a second stage part on each of which a housing container configured to house the substrate is mounted; and a first inspection part and a second inspection part each of which has an imaging unit configured to image the substrate for inspecting the substrate, the method comprising transferring the substrate based on a transfer recipe designating a transfer route for the substrate, the transferring comprising:

acquiring the transfer recipe including both of the first inspection part and the second inspection part as a transfer destination on the transfer route;

deleting, from the transfer recipe, an inspection part associated for deletion with a stage part on which the housing container of a substrate being a transfer object is mounted of the first inspection part and the second inspection part; and
transferring the substrate based on the recipe after the deletion.

\* \* \* \* \*